United States Patent
Modafferi

(10) Patent No.: US 9,485,043 B1
(45) Date of Patent: Nov. 1, 2016

(54) QUADRATURE MODULATION APPARATUS FOR AM STEREO TRANSMITTERS

(71) Applicant: Richard Modafferi, Vestal, NY (US)

(72) Inventor: Richard Modafferi, Vestal, NY (US)

(*) Notice: Subject to any disclaimer, the term of this patent is extended or adjusted under 35 U.S.C. 154(b) by 0 days.

(21) Appl. No.: 15/164,978

(22) Filed: May 26, 2016

Related U.S. Application Data

(60) Provisional application No. 62/203,605, filed on Aug. 11, 2015.

(51) Int. Cl.
  *H04H 20/88* (2008.01)
  *H04H 20/71* (2008.01)
  *H03F 3/181* (2006.01)

(52) U.S. Cl.
  CPC ............ *H04H 20/88* (2013.01); *H03F 3/181* (2013.01); *H04H 20/71* (2013.01)

(58) Field of Classification Search
  CPC ..................................................... H04L 27/364
  USPC ........... 381/1–7, 14–18, 300, 309, 26, 94.1; 327/231, 234; 455/127.1; 375/297
  See application file for complete search history.

(56) References Cited

U.S. PATENT DOCUMENTS

| | | | |
|---|---|---|---|
| 4,638,504 A | 1/1987 | Salek | |
| 6,404,255 B1* | 6/2002 | Filliman | H03H 11/20 327/231 |
| 8,577,313 B2* | 11/2013 | Sorrells | H03C 5/00 455/127.1 |
| 2006/0159198 A1* | 7/2006 | Morimoto | H03F 1/02 375/297 |

* cited by examiner

*Primary Examiner* — Md S Elahee
(74) *Attorney, Agent, or Firm* — David L. Banner

(57) ABSTRACT

A modulation system for AM stereo transmission wherein in a combination of amplitude modulation and phase modulation allows a pair of unique audio channel signals to be modulated onto an AM carrier. When a monophonic audio signal is provided, there is no phase modulation present. However, when a first audio signal (e.g., a "right" channel) differs from a second audio signal (e.g., a "left" audio channel), phase modulation occurs simultaneously with amplitude modulation. The modulation system accepts non-matrixed audio signals and produces quadrature modulation compatible with the industry standard C-QUAM system.

6 Claims, 12 Drawing Sheets

QUADRATURE MODULATION APPARATUS FOR AM STEREO TRANSMITTERS

RELATED APPLICATIONS

This application is a Continuation-in-Part application of U.S. Provisional patent application Ser. No. 62/203,605 filed Aug. 11, 2015 for QUADRATURE MODULATION APPARATUS FOR AM STEREO TRANSMITTERS which is included in its entirety by reference.

FIELD OF THE INVENTION

The invention pertains to amplitude modulation (AM) transmitters and, more particularly, to a stereo AM stereo modulation system not requiring a pre-matrixed input signal.

BACKGROUND OF THE INVENTION

Commercial AM broadcasting has only weakly embraced the broadcasting of stereo signals. For a short period of time there were many commercial AM stations at least experimenting with the concept and at one point in time there were numerous AM receivers produced capable of decoding broadcast AM stereo signals. Several automobile manufactures provided in-dash receivers with that capability.

Many types of AM stereo modulation systems are known in the art. These include quadrature modulation in which a first signal modulates a carrier signal, and a second signal modulates a carrier signaling a 90· phase difference from the first carrier signal. The second, or quadrature, modulator is a suppressed carrier type, such that only the sidebands of the modulated signal remain. The quadrature modulated sidebands are added to the output signal of the first modulator to produce quadrature modulation.

For AM stereo transmission, the input of the first transmitter is the main (L+R) signal and the input of the second transmitter is the stereo (L−R) signal. This is pure quadrature" modulation and as such, it is not compatible with current AM receivers.

A quadrature modulation method which became the de facto standard for stereo AM broadcasting was developed by Motorola Corporation in the early 1980s. This system was invented in 1977 by Norman Parker, Francis Hilbert, and Yoshio Sakaie, and published in an IEEE journal. Using circuitry developed by Motorola Incorporated, this modulation system used quadrature amplitude modulation (QAM) to encode the stereo separation signal. This extra signal is then stripped down in such a way that it is compatible with the envelope detector of older receivers (hence the name C-QUAM (i.e., Compatible QUadrature Amplitude Modulation).

While many implementations of the C-QUAM system have provided, each suffers from its own unique deficiencies. Typically, C-QAUM encoders utilize many stages (typically adders, limiters, modulators, etc.) to produce the desired C-Quam compatible AM stereo signal.

While the need for stereo AM in the commercial broadcasting environment has all but disappeared, the need for AM stereo continues in several small but important environments. Museums and individuals have need for a simple, inexpensive way to provide low power AM signals for local broadcast to monophonic or stereophonic vintage radios in their collections.

It would, therefore, be advantageous to provide a simple, low-cost system for providing both monophonic and stereophonic low power AM C-QUAM compatible broadcast signals for use by museums and individual collectors of vintage and antique AM radio receivers.

SUMMARY OF THE INVENTION

In accordance with the present invention there is provided a C-QUAM compatible AM stereo broadcast encoder (modulator) in which the signal output is an RF carrier having simultaneous amplitude and angle (i.e., phase) modulation. Separate left and right channel stereo audio signals are inputted to produce sum (L+R) amplitude modulation while difference (L−R) audio signals produce angle modulation. There is no need to prematrix the L and R audio inputs prior to applying them to the apparatus in accordance with the invention.

OBJECTS OF THE INVENTION

It is, therefore, an object of the invention to provide a modulator/encoder for an AM transmitter operating at a medium wavelength (e.g., 540-1720 kHz).

It is a further object of the invention to provide a modulator/encoder that produces a monophonic modulation or a C-QUAM-compatible stereo modulation.

It is an additional object of the invention to provide a modulator/encoder that uses a minimum number of parts.

It is another object of the invention to provide a modulator/encoder that may be implemented using vacuum tubes, solid state devices, or a hybrid combination of both.

It is still another object of the invention to provide a modulator/encoder that produces a high quality, relatively low distortion radio frequency signal.

BRIEF DESCRIPTION OF THE DRAWINGS

Various objects, features, and attendant advantages of the present invention will become more fully appreciated as the same becomes better understood when considered in conjunction with the accompanying drawings, in which like reference characters designate the same or similar parts throughout the several views, and wherein.

DETAILED DESCRIPTION OF THE PREFERRED EMBODIMENT

Many types of AM stereo modulation systems are known in the art. For some reason, the Federal Communications Commission (FCC) declined to endorse a standard for AM stereo broadcasting. Rather, the FCC allowed market forces to allow several competing AM stereo broadcast systems to be produced and co-exist.

Nearly all of these prior-art systems accept as signal input pre-matrixed sum and difference signals (i.e., separate left, (L); right, (R), stereo signals become L+R and L−R signals).

Figure 1A:
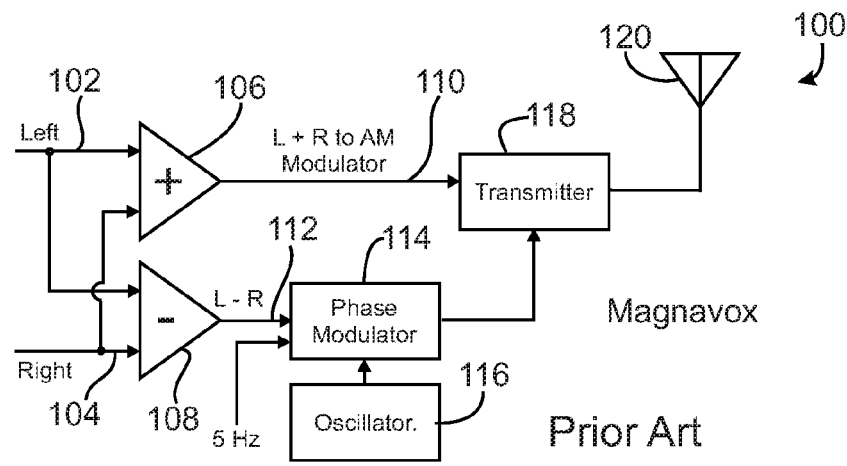
FIG. 1A is a simplified functional block diagram of the Magnavox AM stereo transmission system of the prior art.

Referring first to FIG. 1A is a simplified block diagram of one well-known AM stereo system of the prior art by Magnavox, generally at reference number 100. In the Magnavox system 100, left and right channel audio signals 102, 104, respectively were matrixed into L+R 106 and L−R 108 signals by adders 104, 106, respectively. The L−R signal 110 is then applied to a phase modulator 114 that modulated the output of an oscillator 116 and a modulated output signal thereof being applied to a transmitter 118. Transmitter 118 is assumed to include an AM modulator, not shown, to which the L+R signal 110 is applied. The RF output of transmitter 118 is applied to an antenna 120 to complete the AM stereo transmission system.

Figure 1B:
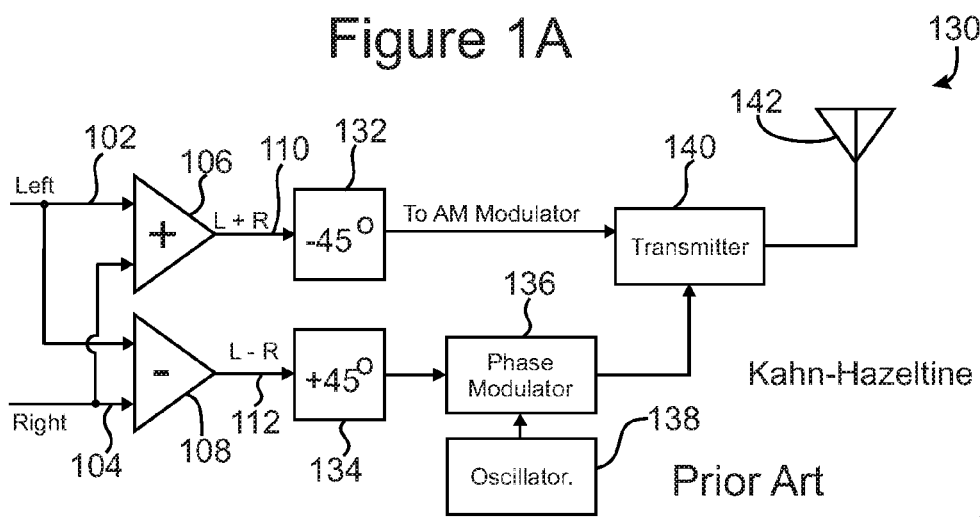
FIG. 1B is a simplified functional block diagram of the Kahn AM stereo transmission system of the prior art.

Referring now also to FIG. 1B, there is shown a simplified system block diagram of another well-known AM stereo transmission system invented Leonard R. Kahn, generally at reference number 130. The Kahn-Hazeltine AM Stereo design is an independent sideband system that used independently modulated upper and lower sidebands. Like the Magnavox system 100, the Kahn-Hazeltine system 130 relied on the pre-matirxing of the left and right channel audio signals 102, 104 by adders 106, 108, respectively. The output of adders 106, 108 are applied to respective −45° and +45° phase shifters 132, 134. The output of −45° phase shifter 132 is applied to the AM modulator portion, not shown, of a transmitter 140 while the output of +45° phase shifter 134 is applied to a phase modulator 136. Phase modulator modulates a signal from oscillator 138 and the modulated signal is also applied to transmitter 140. The output of transmitter 140 is applied to antenna 142 to complete the AM stereo transmission system.

Figure 1C:
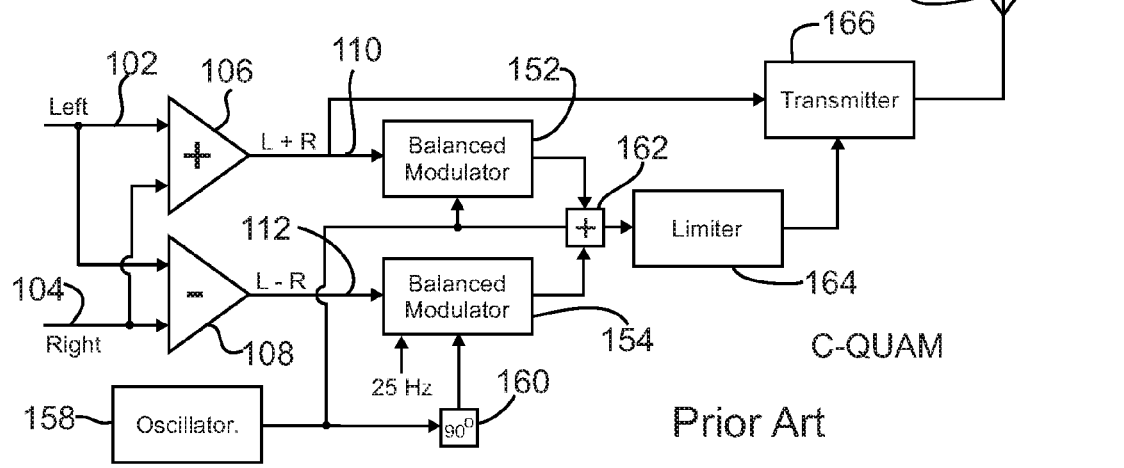
FIG. 1C is a simplified functional block diagram of the CQUAM AM stereo transmission system of the prior art.

Referring now to FIG. 1C, there is shown a simplified system block diagram of the well-known and widely accepted C-QUAM AM stereo broadcast system, generally at reference number 150. Like Magnavox system 100, and Kahn-Hazeltine system 130, C-QAUM system 150 accepts left and right channel audio signals 102, 104, respectively, and matrixes them into L−R signal 110, and L+R signal 112, using adders 106, 108, respectively. The L−R signal 110 is applied to a modulator portion, not shown, of transmitter 164. In addition, L−R signal 110 is applied to the input of a balanced modulator 152. L−R signal 112 is applied to the input of a second balanced modulator 152. A signal from oscillator 158 is applied to both balanced modulators 152 and is phase shifter 90° by phase shifter 160 and the applied to balanced modulator 154, 154. The signal from oscillator 158 is also applied to an adder 162 along with the outputs of balanced modulators 152, 154. The output of added 162 is applied to a limiter 164. The output of limiter 162 is also applied to transmitter 166. The output of transmitter 166 is applied to antenna 168 to complete the AM stereo transmission system.

The novel system of the present invention, unlike these prior art systems, accepts independent left (L) and right (R) audio input signals, and performs matrixing after modulation. In other words, no pre-matrixing of the audio input signals is required.

Only one located prior-art reference, U.S. Pat. No. 4,638,504 to SALEK teaches matrixing after modulation. However, SALAK uses six modulators and five adders to accomplish the process.

In contradistinction, the system of the present invention requires only two modulators and a single adder, thereby resulting in circuit simplification, reduced part count, lower cost, and potentially improved reliability.

The present invention AM stereo quadrature encoder system, called "Symmetrical Phase" produces RF output fully compatible with industry standard C-QUAM decoders.

Figure 2:
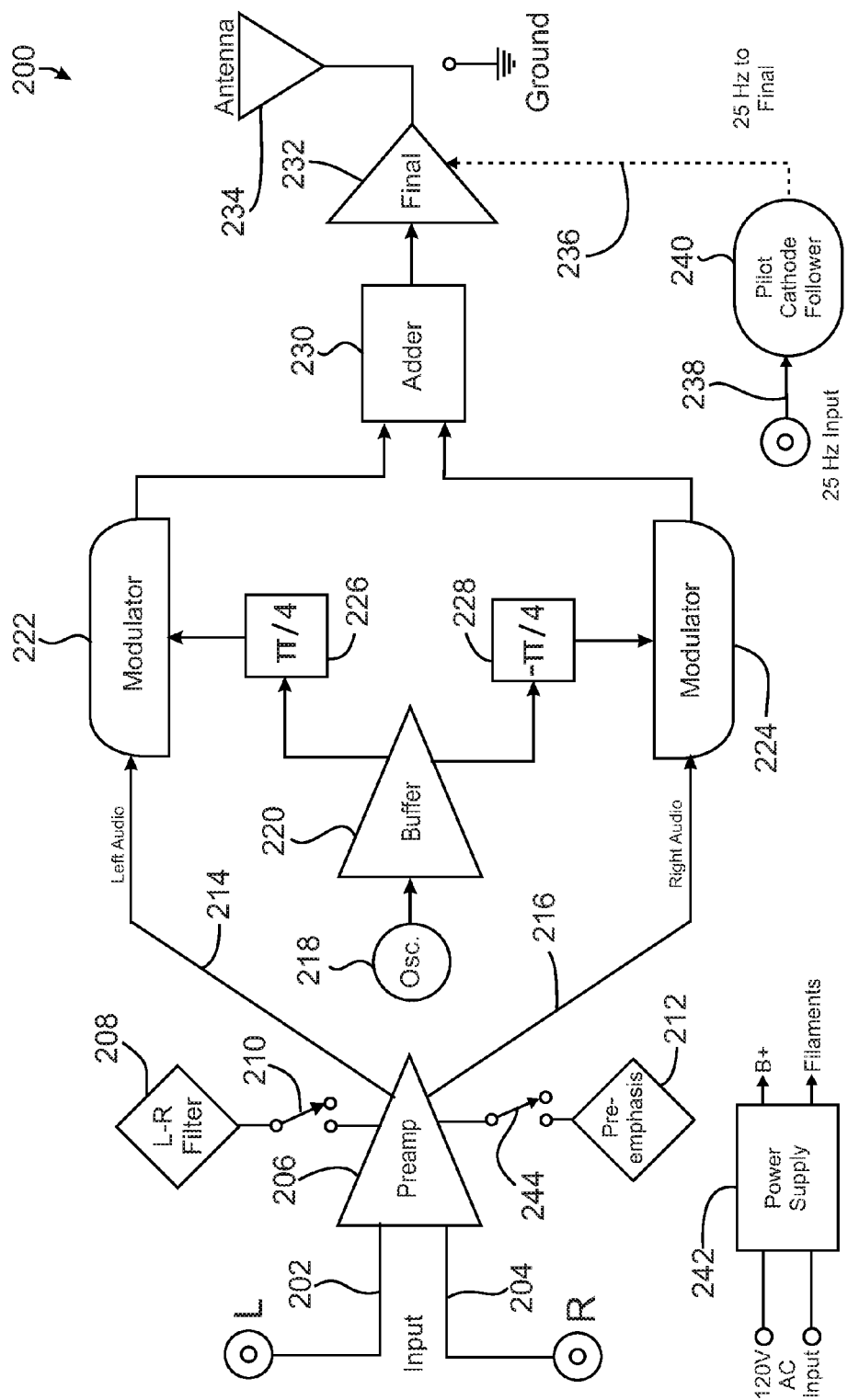
FIG. 2 is a simplified functional block diagram of the AM stereo transmission system in accordance with the present invention.

Referring now also to FIG. 2, there us shown a simplified system block diagram of the Symmetrical Phase AM stereo encoding system of the present invention, generally at reference number 200.

A preamplifier 206 receives left and right channel audio 202, 204, respectively. Preamplifier 206 is implemented using a single 12AU7 dual triode. It will be recognized that other dual triodes exist and any suitable 12AU7 replacement may be substituted therefor.

An L−R filter 208 may be selectively activated by a switch 210.

A pre-emphases network 212 may also be selectively connected to preamplifier 206 by a three-pole switch 244 best seen in FIG. 2.

Left and Right audio outputs, 214, 216, respectively are applied to modulators 222, 224, respectively.

The output of a carrier oscillator 218 is connected to a buffer amplifier 220.

The output of buffer amplifier 220 is applied to lead-lag network 226, 228.

Respective carrier outputs of lead-lag network 226, 228 are also applied to modulators 222, 224.

Outputs of modulators 222, 224 are applied as inputs to adder 230.

The output of adder 230 is passed to the input of a final stage 232. The output of final stage 232 is applied to an antenna 234.

A pilot signal, typically 25 Hz 238 is applied to a pilot cathode stage 240. The output of cathode follow stage 240 is typically applied to a screen of an output tube, not shown in FIG. 2. 25 Hz pilot signal is used by a C-QUAM compatible decoder to determine when an AM stereo signal is being broadcast. It will be recognized that frequencies other than 25 Hz may be used to be compatible with other decoders. Consequently, the invention is not considered limited to the 25 Hz pilot frequency chosen for purposes of disclosure. Rather other non-audible pilot frequencies may be chosen.

A power supply 242 supplies both filament voltage for the tubes as well as one or more different B+ high voltages.

In operation, modulators 222, 224 operate with an RF carrier phase in quadrature. RF carrier oscillator 218 and buffer 220 drives 45-degree lead-lag network 226, 228 that creates a 90-degree carrier phase difference in the RF carrier applied to modulators 222, 224.

Independent left and right stereo audio signals 202, 204 enter preamplifier 206 which sends amplified left, right audio signals 214, 216 to modulators 222, 224. Preamplifier 206 also provides two useful functions: First, an L–R stereo sub channel low-frequency filter 208 may be selectively inserted. Second, an audio high-frequency pre-emphasis network 212 may be selectively connected to preamplifier 206.

Switchable L–R filter 208 reduces distortion caused by excessive phase modulation in adder 230 from some types of low-frequency stereo signals. Normal stereo recorded sounds have little or no energy in L–R sub-channel at low audio frequencies however L–R filter is useful on artificially-produced electronic signals.

Switchable pre-emphasis network 212 provides standard audio high-frequency compensation in accordance with the C-QUAM broadcast standard.

A linear adder 230 sums outputs of modulators 222, 224 and the adder 230 output becomes a C-QUAM compatible AM signal.

Final stage 232 also performs two functions. First, final stage 230 provides linear amplification of the RF signal from adder 230 to level sufficient for broadcast from antenna 234. Second, final stage 232 adds a low-level 25 Hz pilot signal modulation to final stage 232 from external 25 Hz oscillator.

Figure 3A:
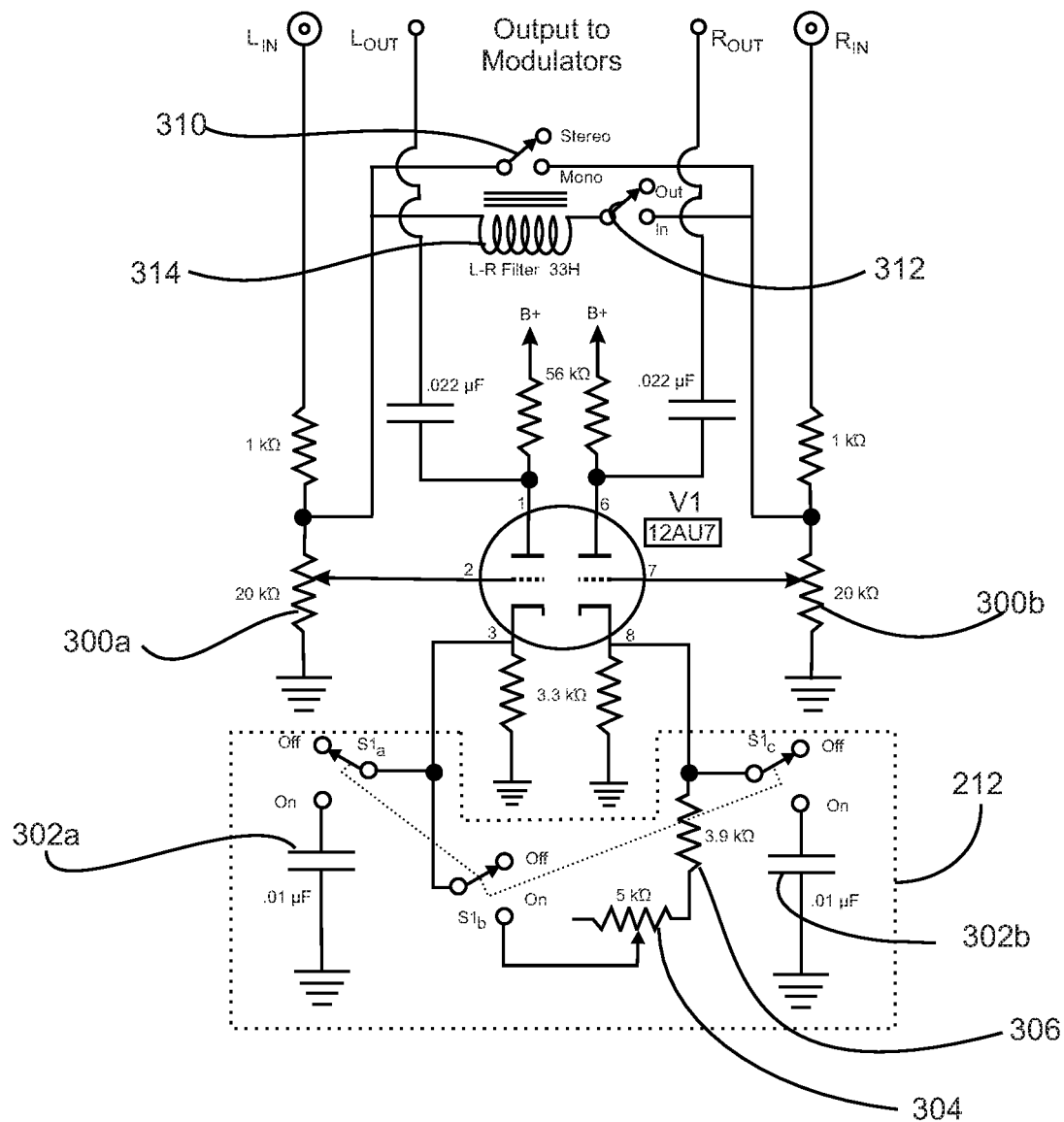
FIG. 3A is a schematic diagram of an exemplary preamp forming a portion of the AM stereo transmission system in accordance with the present invention.

Referring now also to FIG. 3A, there is shown a detailed schematic diagram of an exemplary implementation of preamplifier 206.

Preamplifier 206 is constructed around a 12AU7 dual triode (V1) using a circuit generally well known to those of skill in the art. Each half of dual triode V! amplifies one of the left channel and right channel input audio signals.

Input level controls control the left and right audio channel inputs 300a, 300b, respectively.

A switchable pre-emphasis circuit 212 consists of a three-gang switch $S_{1a}$, $S_{1b}$, and $S_{1c}$, capacitors 304a, 304b, potentiometer 306 and fixed resistor 308. Pre-emphasis circuit 212 selectively provides standard audio high-frequency compensation according to C-QUAM broadcast practice.

A stereo-mono switch 310 interconnects left and right inputs so that identical signals are applied to the girds of both halves of dual triode V1.

A switch 312 selectively imposes an L–R filter 208 (a relatively high inductance) between left and right inputs to reduce distortion caused by excessive phase modulation in adder 230 from some types of low-frequency stereo input signals. In the embodiment chosen for purposes of disclosure, a 33H choke has been found satisfactory for the application.

Figure 3B:
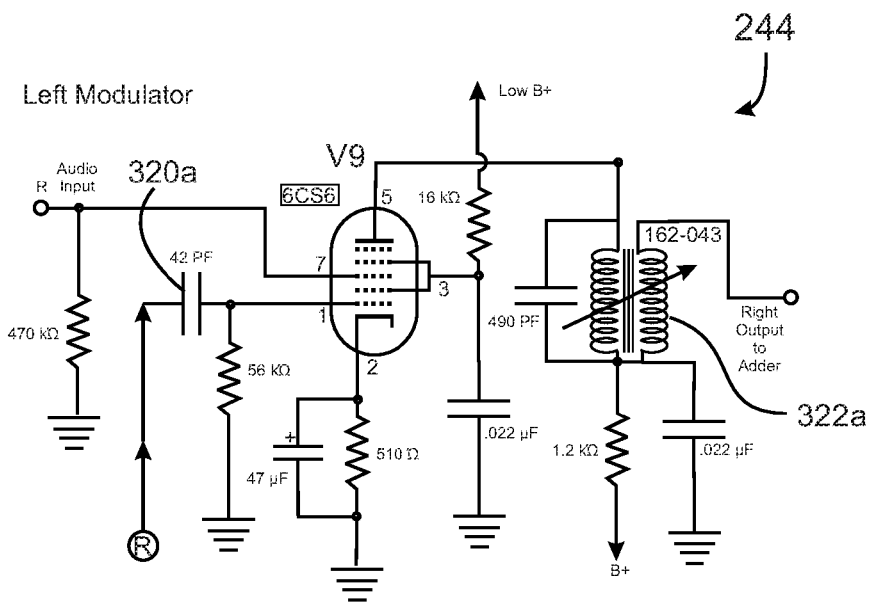
FIGS. 3B-3C are schematic diagrams of exemplary right channel and left channel, respectively modulators forming portions of the AM stereo transmission system in accordance with the present invention.
Figure 3C:
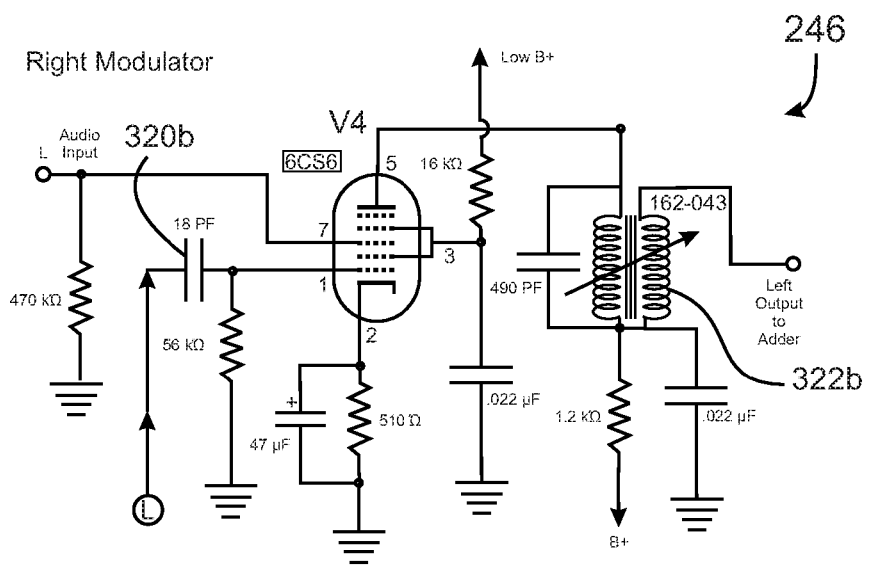

Referring now also to FIGS. 3B and 3C, there are shown detailed schematic diagrams of left and right modulators 244, 246, respectively. Left and right modulators are substantially identical except for minor component values, for example, capacitors 320a, 320b have values of 47 and 18 pF, respectively.

Coils 322a, 322b are labeled "162-043" that refers to a McIntosh Laboratory, Inc. of Binghamton, N.Y. part number. The part is a generic medium wave (i.e., 540 kHz-1800 kHz) antenna coupling transformer. These particular coils were selected based upon availability to the Applicant and it will be realized by those of skill in the art that numerous equivalent coils from other manufactures or suppliers may be available. Consequently, the invention is not considered limited to the particular coil part number chosen for purposes of disclosure. Rather, the invention is intended to cover any and all equivalent coils.

Each modulator 222, 224 utilizes at single 6CS6 pentagrid amplifier tube to perform the AM signal modulation function for respective left and right channels.

Figure 3D:
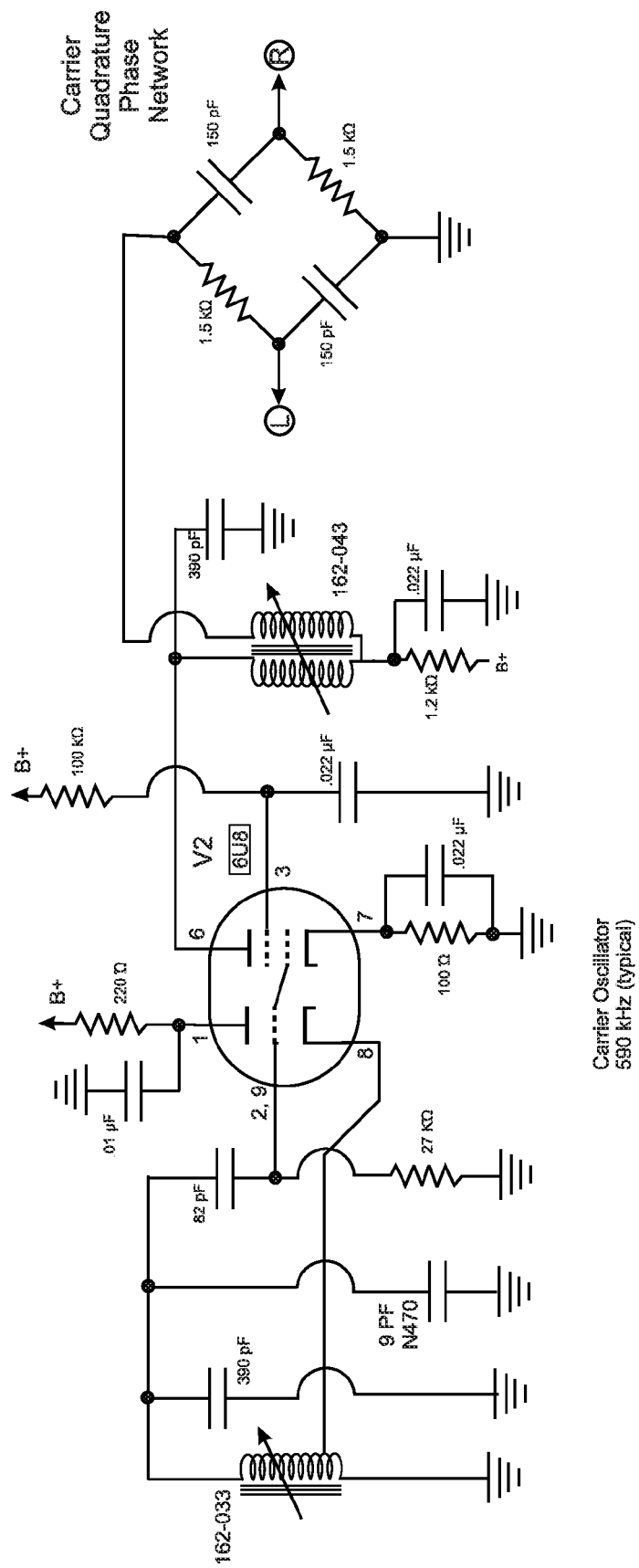
FIG. 3D is a schematic diagram of an exemplary oscillator, buffer, and quadrature network forming a portion of the AM stereo transmission system in accordance with the present invention.
Figure 3E:
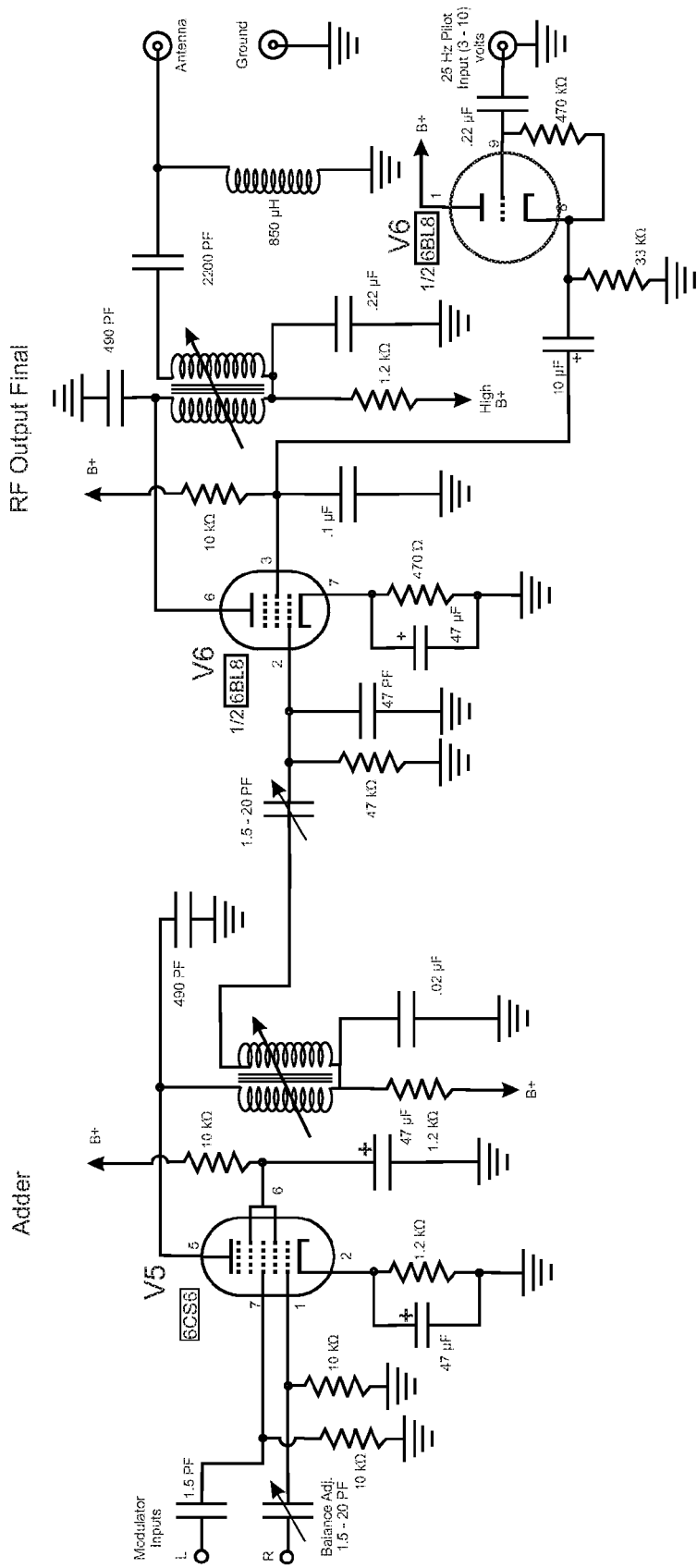
FIG. 3E is a schematic diagram of an exemplary adder and RF final stage forming a portion of the AM stereo transmission system in accordance with the present invention.
Figure 3F:
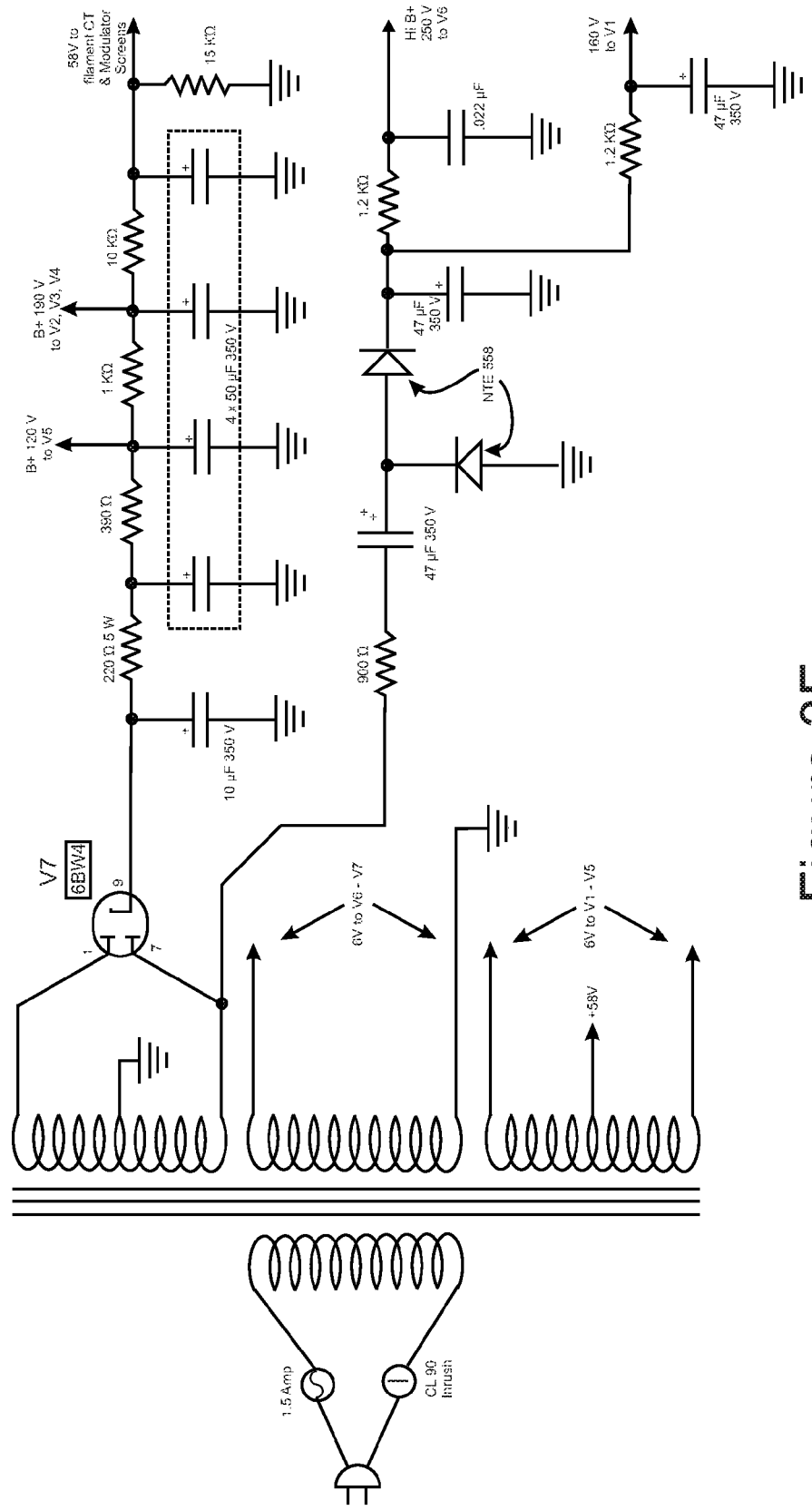
FIG. 3F is a schematic diagram of an exemplary power supply forming a portion of the AM stereo transmission system in accordance with the present invention.

Referring now to FIG. 3D, there is shown a detailed schematic diagram of oscillator 218, buffer 220, and the quadrature phase network. The RF carrier oscillator utilizes the triode portion of a 6U8 tube V2. The pentode portion of the 6U8 is used as a buffer for the RF carrier oscillator. The grids of the triode and pentode portions are shown internally connect to simplify the schematic diagram. In actuality, the grid connection is generally made externally.

Coil part number 162-033, also a McIntosh part number, is a standard broadcast band (i.e., 540 kHz-1800 kHz) oscillator. Equivalent oscillator coils are also available from a number of manufactures and/or suppliers believed to be known to those of skill in the art. Therefore, the invention is not considered limited to the coil part number chosen for purposes of disclosure. Rather, the invention is intended to include any and all equivalent coils.

It will be recognized that a solid state implementation of the novel Quadrature Modulation Apparatus for Am Stereo Transmitters may be substituted for the tube-based implantation of FIGS. 3A-3D discussed hereinabove.

Figure 4:
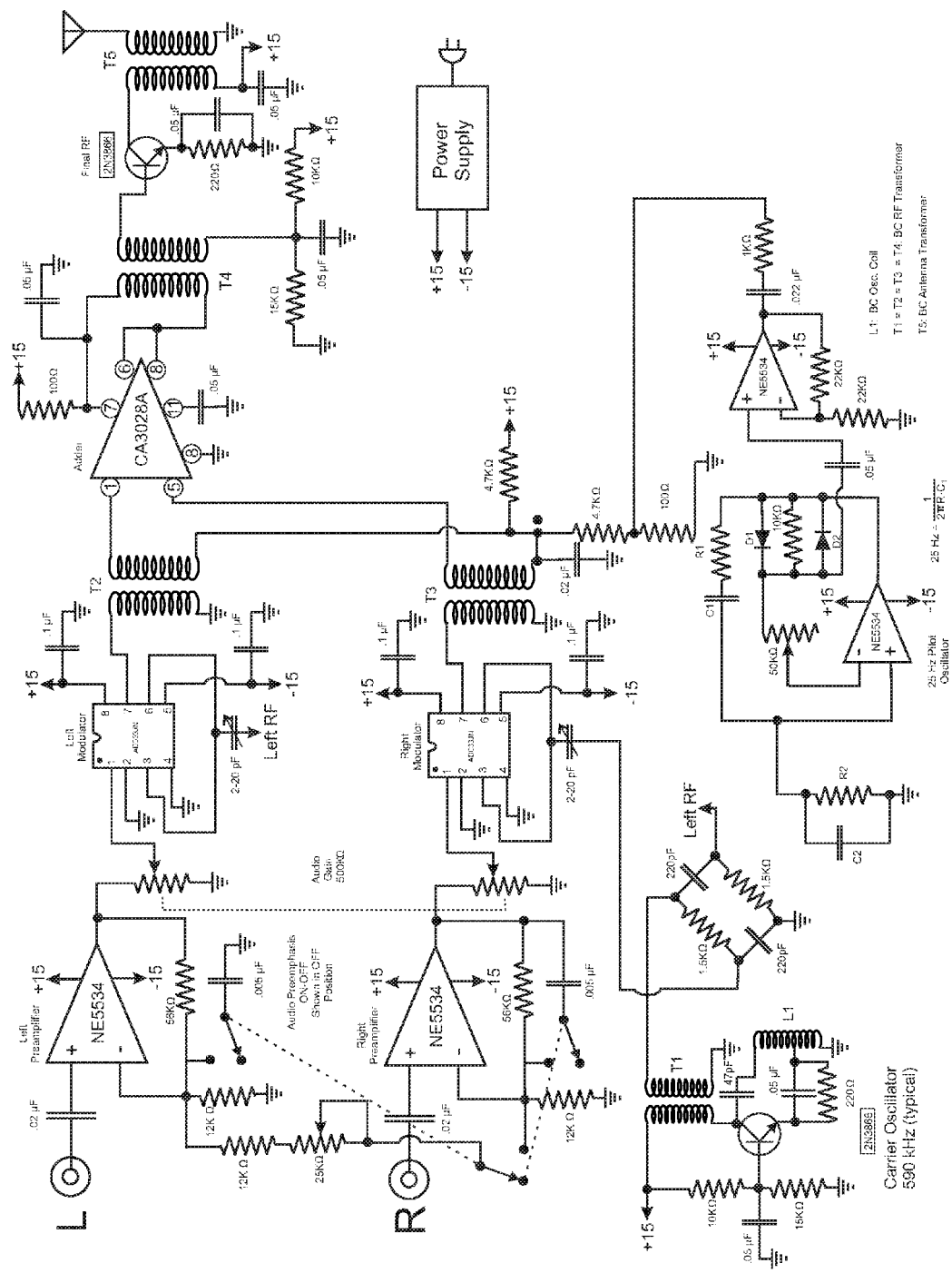
FIG. 4 is a schematic diagram of a solid state implementation of the AM stereo transmission system in accordance with the present invention.

Referring now also to FIG. 4, there is shown a schematic diagram of a typical solid state implementation based on the system block diagram of FIG. 2. As the substitution of solid state devices for tubes are believed to be well known to those of skill in the art, not detailed description is provide herein. The novelty of the disclosed and claimed apparatus is provided in the system block diagram of FIG. 2.

The FIGS. 5A-5D are vector diagrams representing radio-frequency signals frozen in time in the upper-right quadrant of a vector map for various input signal conditions. It should be understood that in time, all resultant vectors in FIGS. 5A through 5D rotate counterclockwise at a frequency $\omega_{ci}$ (e.g., at approximately 540-1700 kHz) as shown at reference number 430.

Figure 5A:
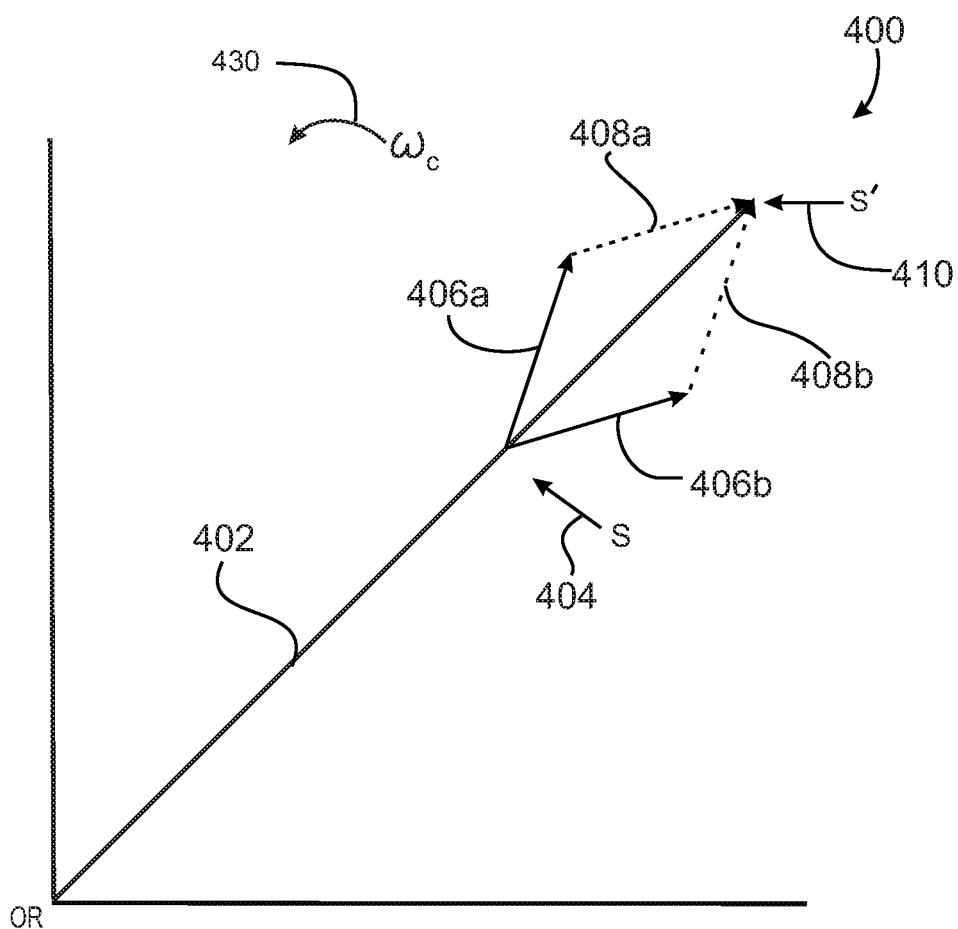
FIG. 5A is a vector diagram representation of a monophonically modulated AM signal.

Referring now also to FIG. 5A, there is shown a single t vector diagram of a monophonically modulated AM signal, generally at reference number 400.

A single carrier vector 402 having an unmodulated magnitude S 404 has symmetrical sidebands 406a and 406b. When sidebands 406a, 406b are graphically added, shown schematically at 408a, 408b representing sidebands 406a, 406b, respectively "collapsing" toward carrier vector 402, the sidebands 406a, 406b graphically add, thereby extending the length of vector 402 to a new length S' 410.

Figure 5B:
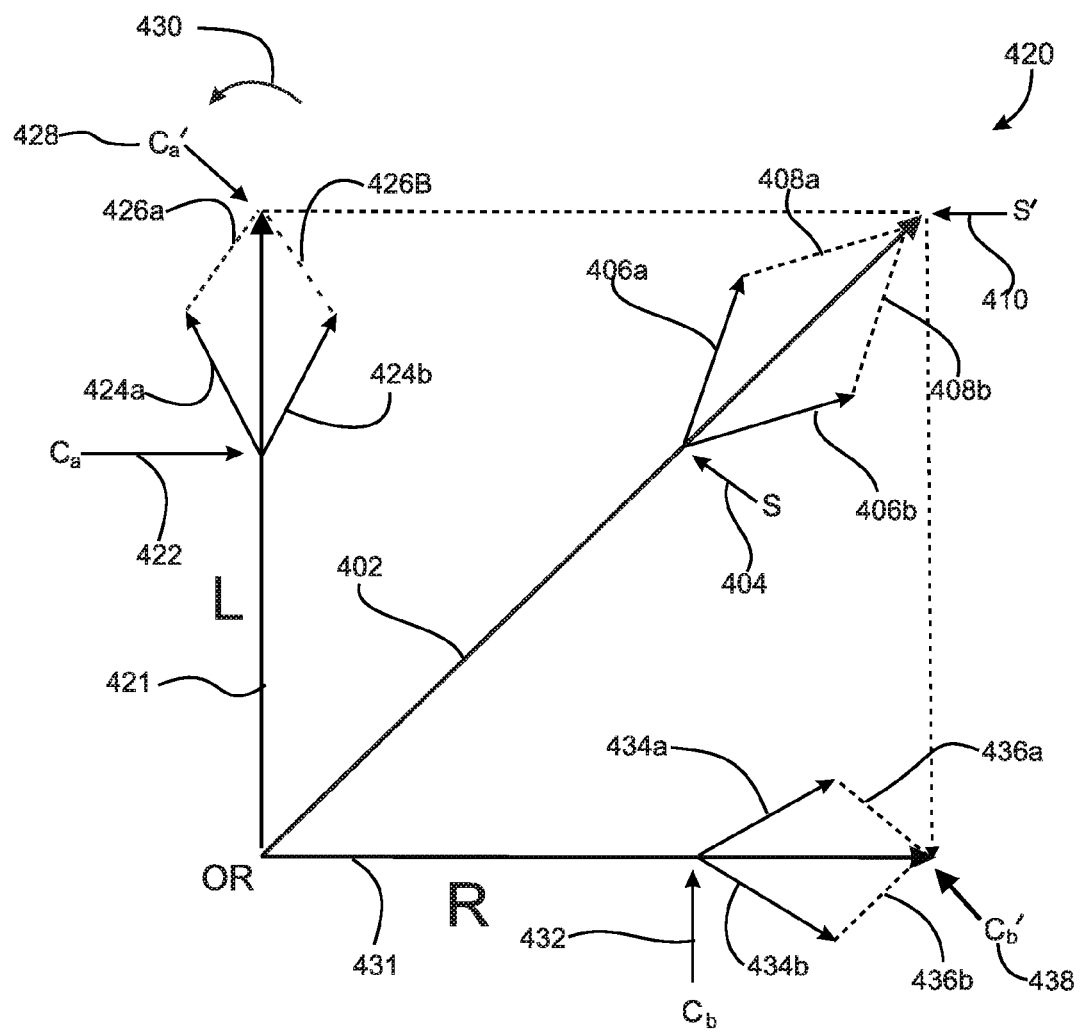
FIG. 5B is a vector diagram representation of a stereophonically modulated AM signal where the left and right channels are equal.

Referring now also to FIG. 5B, there is shown a single vector diagram of a stereophonically modulated AM signal, with the modulation levels of left and right channels equal, generally at reference number 420. Note that when left and right channels are equal there is no stereophonic information present. Consequently, this are equivalent to a monophonic signal such as shown as vector 402 in FIG. 5A.

Left and right signal vectors 421, 431, are shown on the Y-axis and X-axis, respectively. Each vector 421, 431 have a respective length $C_a$ 422 and $C_b$ 432, respectively. Vectors 421, 431 have respective sidebands 424a, 424b, and 434a, 434b. Sidebands 424a, 424b, and 434a, 434b add graphically (represented by respective lines 426a, 426b and 436a, 436b resulting in vectors 421, 431 having respective lengths $C_a'$ 428 and $C_b'$ 438. Vector 402 is reproduced in FIG. 5B, Referring now also to FIG. 5C, there is shown a vector diagram of a stereophonically modulated AM signal, with the level of left channel lower than the level right channel, generally at reference number 440. The modulated carrier vector 448 is shifted in phase by angle θ 446 that results in phase modulation of the carrier.

Figure 5C:
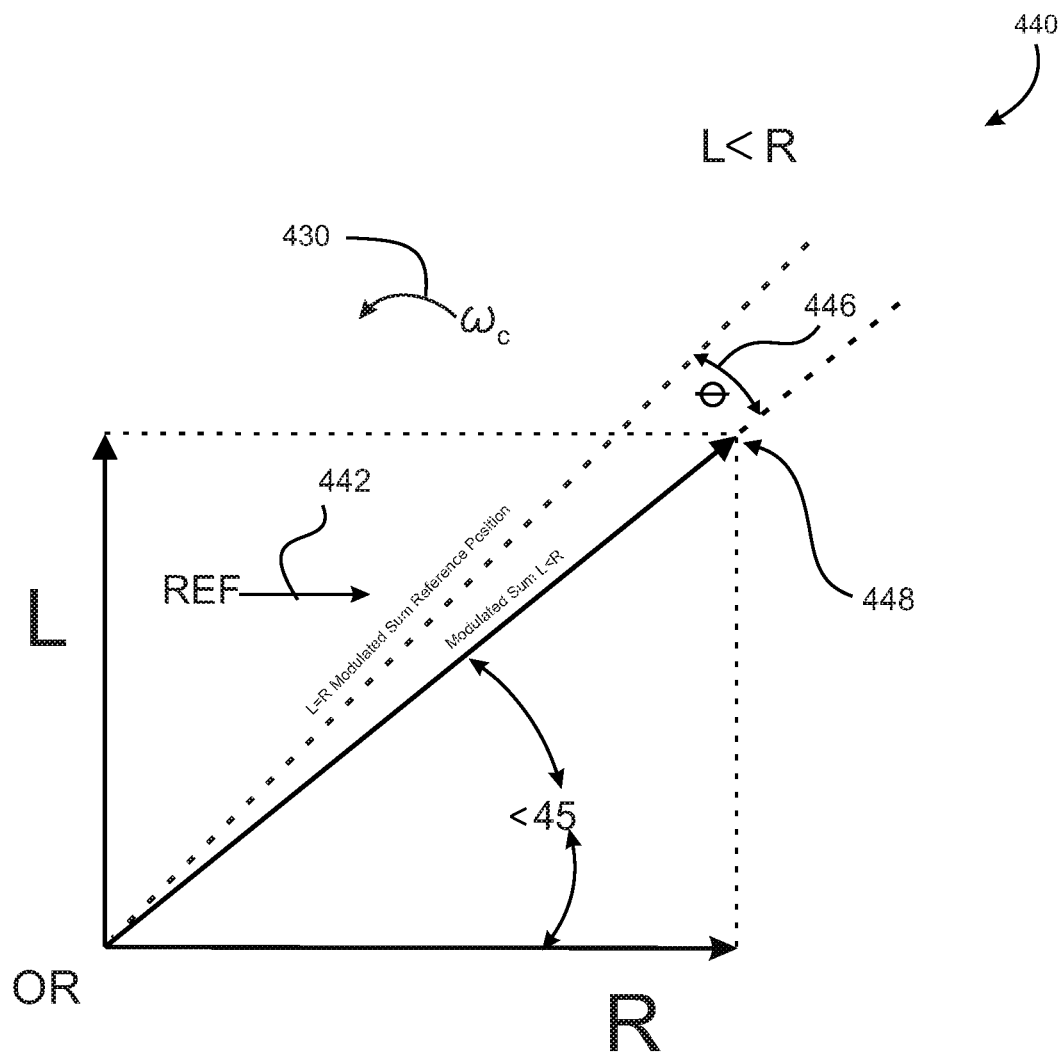
FIG. 5C is a vector diagram representation of a stereophonically modulated AM signal where the left channel is less than the right channel.
Figure 5D:
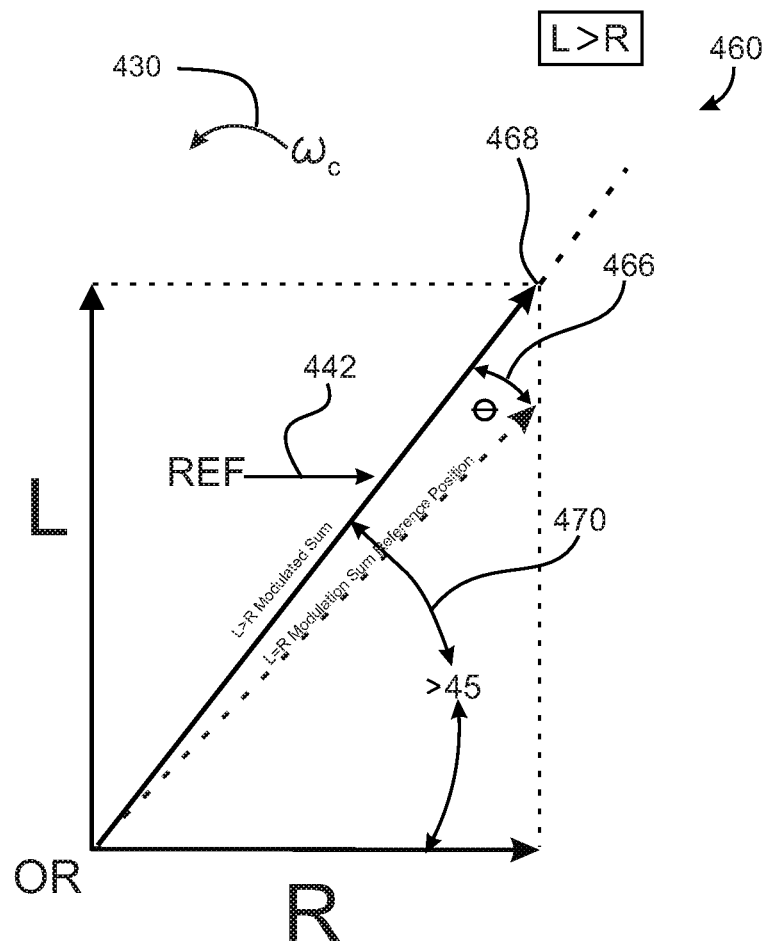
FIG. 5D is a vector diagram representation of a stereophonically modulated AM signal where the left channel is greater than the right channel.

Referring now also to FIG. 5D, there is shown a single quadrant vector diagram of a stereophonically modulated AM signal, with the level of left channel higher than the level right channel, generally at reference number 460. The modulated carrier vector 470 is shifted in phase by angle θ 466 that results in phase modulation of the carrier.

Phase and amplitude modulation occur simultaneously as shown in FIGS. 5C, 5D. Amplitude modulation occurs as respective signal vectors 448,468 change lengths in response to modulation represented by the instantaneous lengths of sidebands 424a, 424b, 434a, 434b graphically added to the unmodulated carrier. Angles θ 446, 466 indicate the instantaneous angular displacement of signal vectors Vectors 448, 470 shown in FIGS. 5C and 5D, respectively, result from a carrier with modulation, the modulating signal vectors not being shown. FIG. 5C illustrates condition for L<R. Resulting vector sum 448 is displaced from position L=R Modulated Sum Reference Position 442 by angle θ 446 indicating phase and well as amplitude modulation are present. In similar manner, FIG. 5D illustrates condition for L>R. Here, resultant vector 470 is shown displaced by angle θ 466 direction opposite to θ 446 of FIG. 4C. L>R; phase modulation is present here also.

One can form picture of a resultant vector represented by the two instantaneous positions of vectors 448, 470 in FIGS. 5C, 5D as wobbling (i.e., rotating) back and forth symmetrically across 45-degree reference position L=R Modulated Sum Reference Position when averaged over time when L–R stereo information is present.

Analysis of stereo output of the novel system of the invention shows that the output on stereo signals averaged over time indicates that total phase shift, summed by numerical integration, approaches zero. This is beneficial as it result is little or no distortion in envelope detectors of monophonic radios.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. An apparatus for simultaneously amplitude and phase modulating a radio frequency carrier to convey stereophonic audio information thereupon, comprising:

a) a radio frequency carrier source having an output signal;

b) a quadrature phase shifting network connected to said output of said radio frequency carrier source, said quadrature phase shifting network having two outputs, a first of said two output providing a first output signal comprising a radio frequency signal phase shifted +45 degrees relative to a phase of said output signal, and a second output signal comprising a radio frequency signal phase shifted –45 degrees relative to a phase of said output signal; and c) a first modulator having an input connected to both said first output of said quadrature phase shifting network and to a first audio signal source, said first modulator having a first modulator output;

d) a second modulator having an input connected to both said second output of said quadrature phase shifting network and to a second audio signal source, said second modulator having a second modulator output; and e) a linear adder having a first input connected to said first modulator output and a second input connected to said second modulator output, said adder having an output; whereby said output of said adder presents a radio frequency output signal simultaneously amplitude and phase modulated by audio signals from said first audio signal source and said second audio signal source;

f) an apparatus for injecting a low frequency pilot signal into said simultaneously amplitude and phase modulated radio frequency signal at said output of said adder, wherein said low frequency pilot signal comprises an approximately a 25 hertz pilot signal.

2. The apparatus for simultaneously amplitude and phase modulating a radio frequency carrier to convey stereophonic audio information thereupon as recited in claim 1, wherein said radio frequency carrier source having an output signal comprises:

i) an oscillator having a predetermined frequency of oscillation; and ii) a buffer operatively connected to an output of said oscillator.

3. The apparatus for simultaneously amplitude and phase modulating a radio frequency carrier to convey stereophonic audio information thereupon as recited in claim 1, wherein said first audio source and second audio signal source comprises an audio preamplifier.

4. The apparatus for simultaneously amplitude and phase modulating a radio frequency carrier to convey stereophonic audio information thereupon as recited in claim 1, wherein said audio preamplifier further comprises a pre-emphasis network.

5. The apparatus for simultaneously amplitude and phase modulating a radio frequency carrier to convey stereophonic audio information thereupon as recited in claim 1, wherein said audio preamplifier further comprises an L–R filter.

6. The apparatus for simultaneously amplitude and phase modulating a radio frequency carrier to convey stereophonic audio information thereupon as recited in claim 1, further comprising a radio frequency final amplifier connected to said output of said adder.

* * * * *